(12) United States Patent
Lai et al.

(10) Patent No.: US 7,349,219 B2
(45) Date of Patent: Mar. 25, 2008

(54) MEMORY MODULE ASSEMBLY INCLUDING A CLIP FOR MOUNTING A HEAT SINK THEREON

(75) Inventors: Cheng-Tien Lai, Tu Cheng (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 113 days.

(21) Appl. No.: 11/308,848

(22) Filed: May 15, 2006

(65) Prior Publication Data

US 2007/0263360 A1    Nov. 15, 2007

(51) Int. Cl.
*H05K 7/20* (2006.01)
(52) U.S. Cl. ............... 361/719; 361/704; 361/715; 257/718; 257/719; 165/80.3; 165/185
(58) Field of Classification Search ............... None
See application file for complete search history.

(56) References Cited

U.S. PATENT DOCUMENTS

| | | | | |
|---|---|---|---|---|
| 5,109,318 A | * | 4/1992 | Funari et al. ............... 361/710 |
| 5,815,371 A | * | 9/1998 | Jeffries et al. ............... 361/704 |
| 5,966,287 A | * | 10/1999 | Lofland et al. ............. 361/704 |
| 6,119,765 A | * | 9/2000 | Lee ........................... 165/80.3 |
| 6,188,576 B1 | * | 2/2001 | Ali et al. ..................... 361/704 |
| 6,233,150 B1 | * | 5/2001 | Lin et al. ..................... 361/704 |
| 6,353,538 B1 | * | 3/2002 | Ali et al. ..................... 361/728 |
| 6,535,387 B2 | * | 3/2003 | Summers et al. ........... 361/704 |
| 6,765,797 B2 | * | 7/2004 | Summers et al. ........... 361/704 |
| 7,215,551 B2 | * | 5/2007 | Wang et al. ................. 361/707 |
| 7,221,569 B2 | * | 5/2007 | Tsai ........................... 361/704 |
| 2003/0026076 A1 | | 2/2003 | Wei | |
| 2004/0156174 A1 | * | 8/2004 | Rubenstein et al. ........ 361/705 |

* cited by examiner

*Primary Examiner*—Boris Chervinsky
(74) *Attorney, Agent, or Firm*—Jeffrey T. Knapp

(57) ABSTRACT

A memory module assembly includes a printed circuit board (30) having a heat-generating electronic component (32) thereon, a heat sink (10) and a clip (20) for securing the heat sink onto the heat-generating electronic component. The heat sink includes a base (12) and a plurality of fins (14) arranged on the base. A plurality of recesses is defined in the heat sink. The clip includes a body (22) resting against a face of the printed circuit board and elastic hooks (24) extending from the body. The hooks are received in the recesses and resiliently press the base of the heat sink toward the heat-generating electronic component, whereby the clip clamps the heat sink and the printed circuit board together.

9 Claims, 6 Drawing Sheets

1

MEMORY MODULE ASSEMBLY INCLUDING A CLIP FOR MOUNTING A HEAT SINK THEREON

FIELD OF THE INVENTION

The present invention relates generally to a memory module assembly, and more particularly to a memory module assembly including a clip and a heat sink, where the heat sink is mounted to an electronic component attached on a surface of a printed circuit board of the memory module assembly via the clip.

DESCRIPTION OF RELATED ART

Memory module assemblies that are currently in the use generally do not require cooling devices to dissipate heat. The electronic components and memory module assemblies currently available, which are operated on or below 66 MHz do not generate heat that requires a cooling device for dissipating the heat. However, as the industry progresses, the memory module assemblies, such SDRAM DIMM memory module assemblies are required to be operated on 100 MHz or above. For these up-to-date memory module assemblies, heat sinks will be required to remove heat generated thereby. However, since the memory module assemblies each have a little board area and are crowdedly mounted on a motherboard of a computer, how to mount the heat sink to the memory module assembly becomes an issue.

SUMMARY OF THE INVENTION

A memory module assembly in accordance with a preferred embodiment of the present invention comprises a printed circuit board having a heat-generating electronic component thereon, a heat sink and a clip for securing the heat sink onto the heat-generating component. The heat sink comprises a base and a plurality of fins arranged on the base. A plurality of recesses is defined in the base. The clip comprises a body resting against a bottom face of the printed circuit board and a plurality of elastic hooks extending from the body. Each hook comprises a pressing portion extending from the body and an engaging portion extending from a free end of the pressing portion. The pressing portions resiliently press the base of the heat sink toward the heat-generating component, whereby the clip clamps the heat sink and the printed circuit board together.

Other advantages and novel features will become more apparent from the following detailed description of preferred embodiments when taken in conjunction with the accompanying drawings, in which:

DETAILED DESCRIPTION OF THE INVENTION

Figure 1:
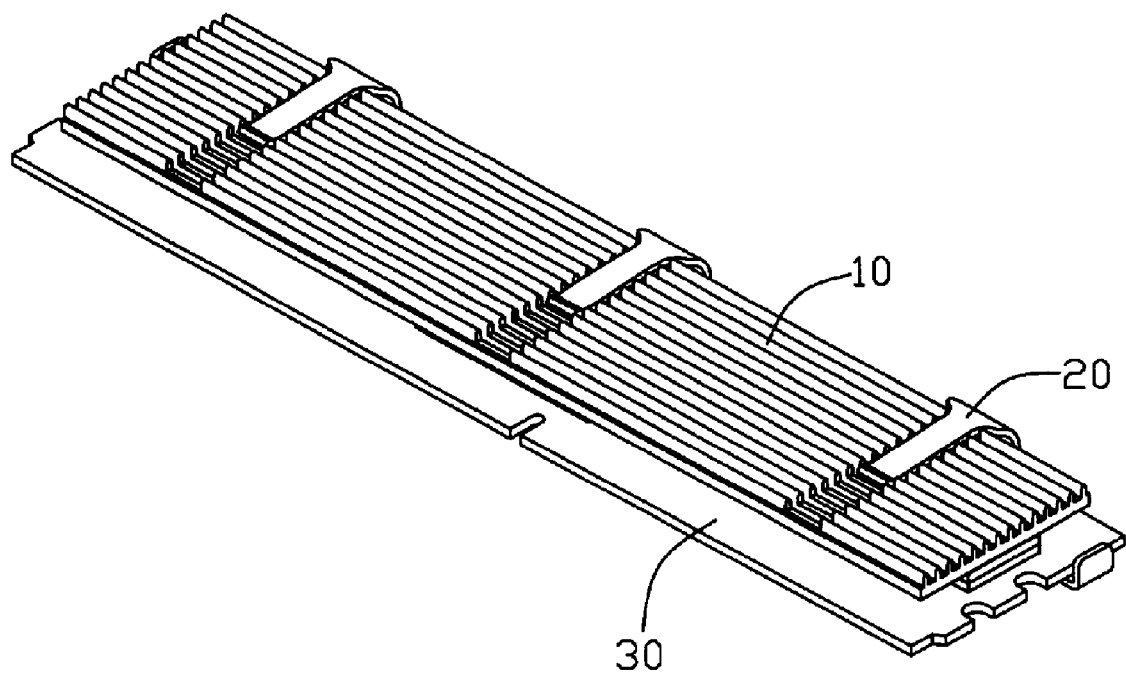
FIG. 1 is an isometric view of a memory module assembly in accordance with a preferred embodiment of the present invention.
Figure 2:
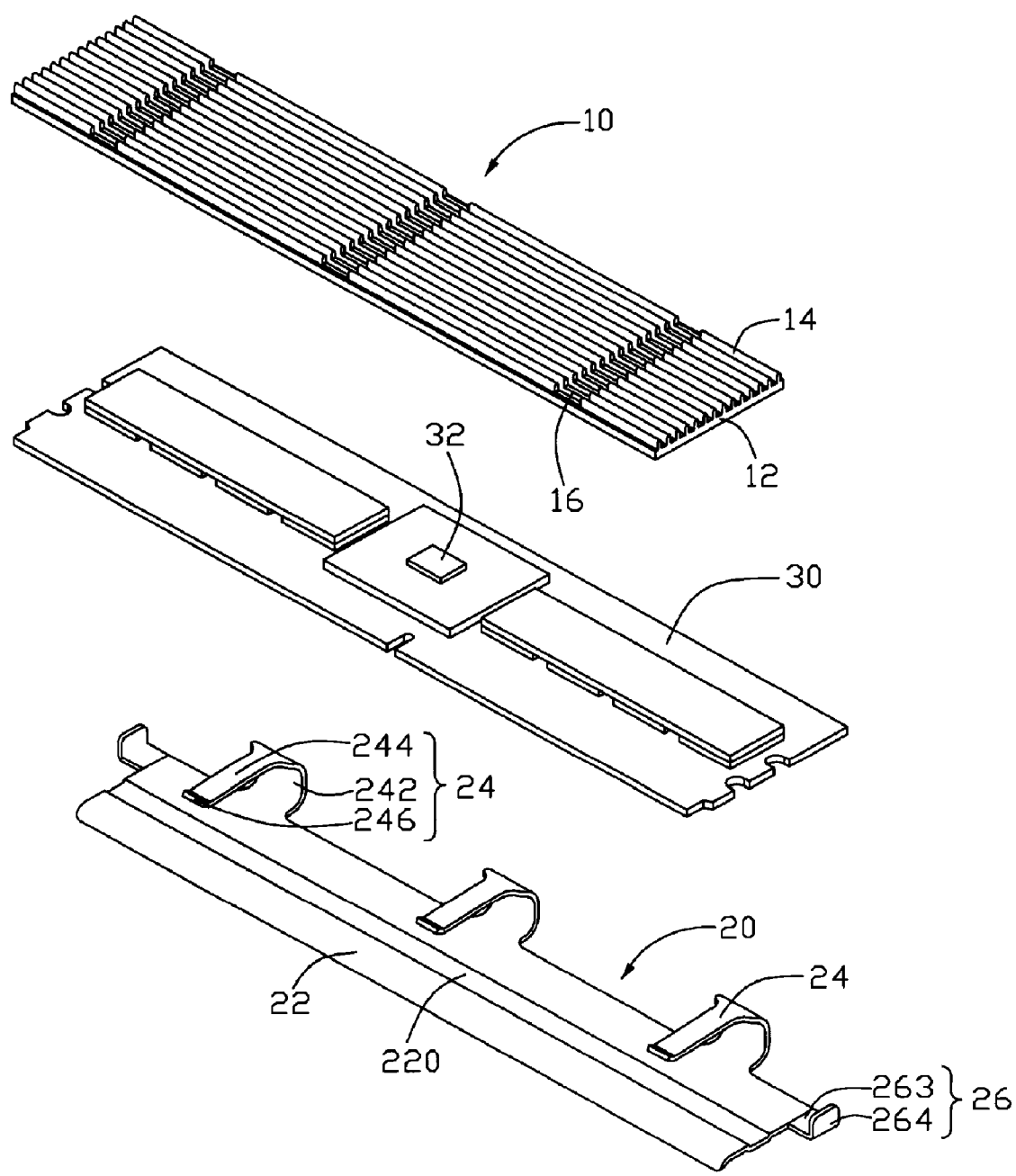
FIG. 2 is an exploded view of FIG. 1.
Figure 3:
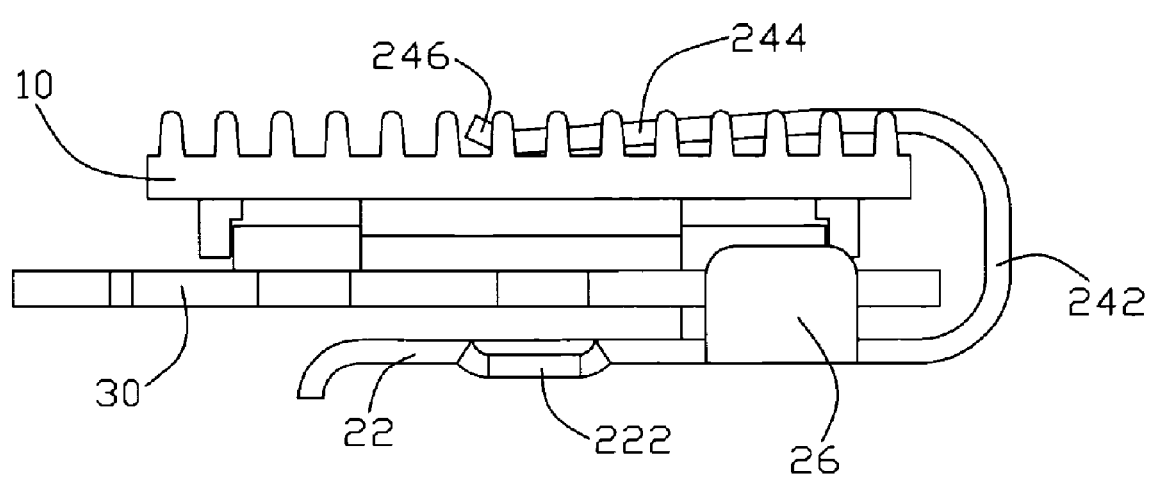
FIG. 3 is a view similar to FIG. 1, viewed from a lateral side aspect.

Referring to FIGS. 1-3, a memory module assembly in accordance with a preferred embodiment of the present invention comprises a heat sink 10, a clip 20 mounting the heat sink 10 onto a printed circuit board 30 with a heat-generating electronic component 32 mounted on a top surface thereof. The printed circuit board 30 generally has a rectangular shape.

The heat sink 10 comprises a base 12 for contacting the heat-generating electronic component 32 and a plurality of fins 14 arranged on an upper surface of the base 12. Three recesses 16 are defined in the fins 14 of the heat sink 10, extending in a direction perpendicular to long sides of the base 12.

The clip 20 comprises a rectangular-shaped body 22. The body 22 has a pair of long sides and a pair of short sides. A groove 220 is defined in a middle of the body 22 and is recessed in a direction along the long sides of the body 22 to form a rib 222 on a bottom of the body 22 to strengthen the body 22 (seeing FIG. 3). The clip 20 comprises three elastic hooks 24 upwardly and inwardly extending from an edge of one of the long sides of the body 22 and a pair of opposite blocks 26 extending from edges of the opposite short sides of the body 22. Each hook 24 comprises a curved portion 242 extending from an edge of the long side of the body 22, an elastic pressing portion 244 extending from the curved portion 242 and an engaging portion 246 extending from a free end of the pressing portion 244, for facilitating an engagement of the clip 20 with the heat sink 10. The curved portions 242 are arranged around the long side of the printed circuit board 30. The pressing portions 244 of the hooks 24 are received in the recesses 16 and press the base 12 of the heat sink 10 tightly against the heat-generating electronic component 32. The engaging portions 246 of the clip 20 are inclined toward the body 22 and rest in the recesses 16 of the heat sink 10 for reinforcing a stabilization of the hooks 24 with the fins 14 of the heat sink 10. Each block 26 comprises an ear portion 263 extending from an edge of the short side of the body 22 and parallel to the body 22 and an ending portion 264 upwardly extending from a free end of the ear portion 263 and perpendicular to the body 22. Two opposite ends of the printed circuit board 30 are blocked between the ending portions 264 of the blocks 26. The hooks 24 press the heat sink 10 onto a top of the heat-generating electronic component 32 on the printed circuit board 30 and the body 22 of the clip 20 rests against a bottom surface of the printed circuit board 30.

Referring to FIG. 2, in attachment of the heat sink 10 to the printed circuit board 30, the heat sink 10 is placed on a top surface of the heat-generating electronic component 32 of the printed circuit board 30. The pressing portions 244 of the hooks 24 are received in the recesses 16 and resiliently abut against the heat sink 10. The engaging portions 246 of the hooks 24 are caused to rest on the top surface of the base 12 of the heat sink 10. At this stage, the body 22 of the clip 20 is attached on the bottom surface of the printed circuit board 30. The clip 20 clamps the heat sink 10 and the printed circuit board 30 together with the heat sink 10 and the printed circuit board 30 being sandwiched between the hooks 24 and the body 22. The heat sink 10 is thus pressed toward the top surface of the heat-generating electronic component 32 mounted on the printed circuit board 30, to have an intimate contact with the top surface of the heat-generating electronic component 32 for receiving heat therefrom.

Figure 4:
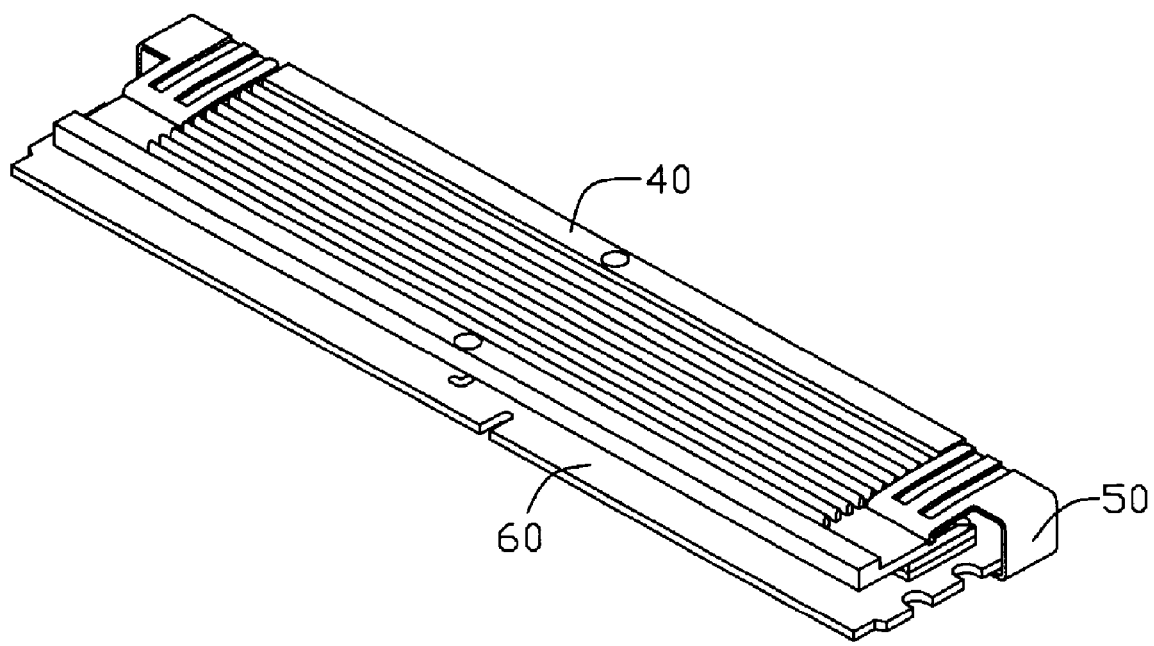
FIG. 4 is an isometric view of a memory module assembly in accordance with another embodiment of the present invention.
Figure 5:
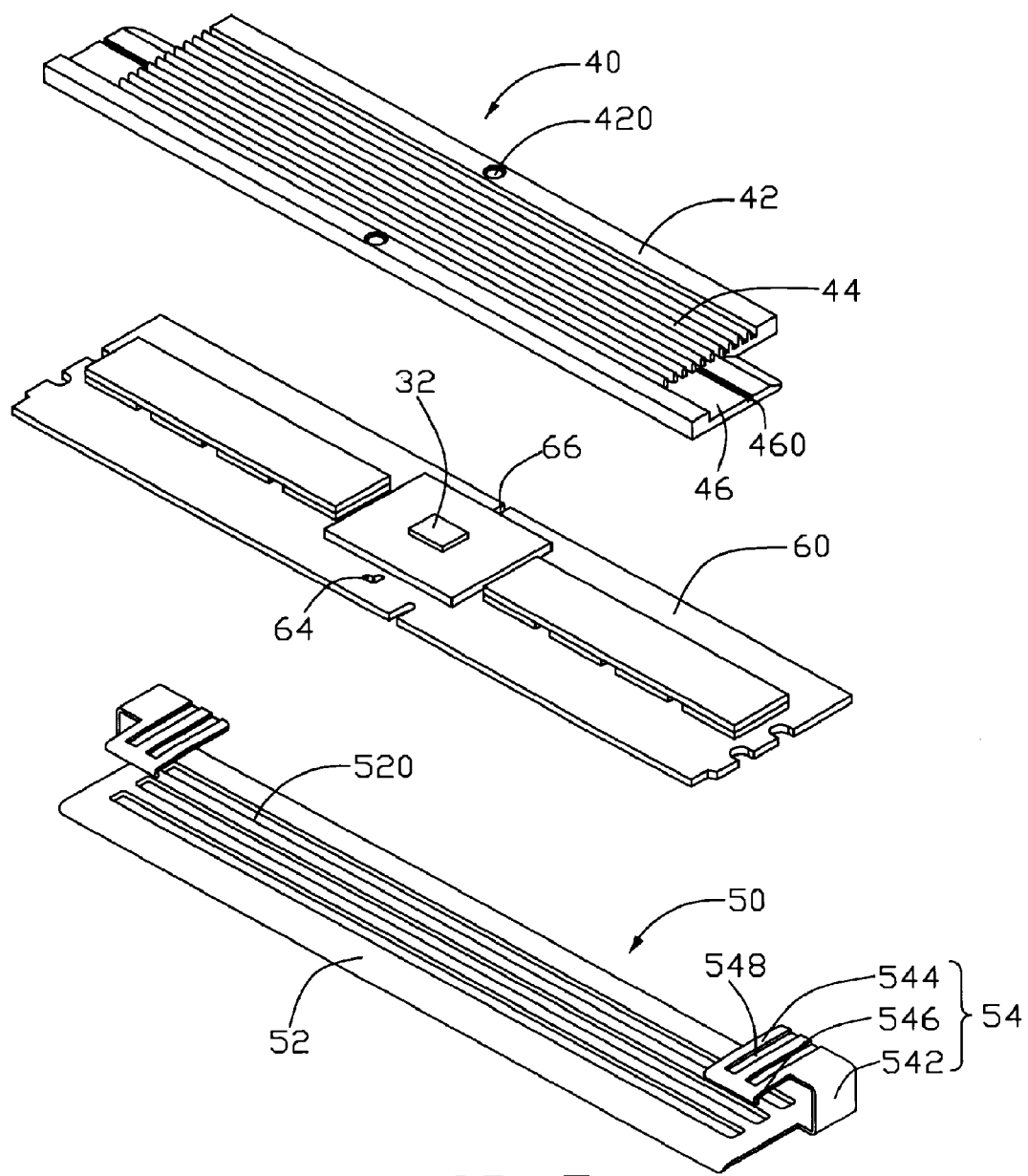
FIG. 5 is an exploded view of FIG. 4.
Figure 6:
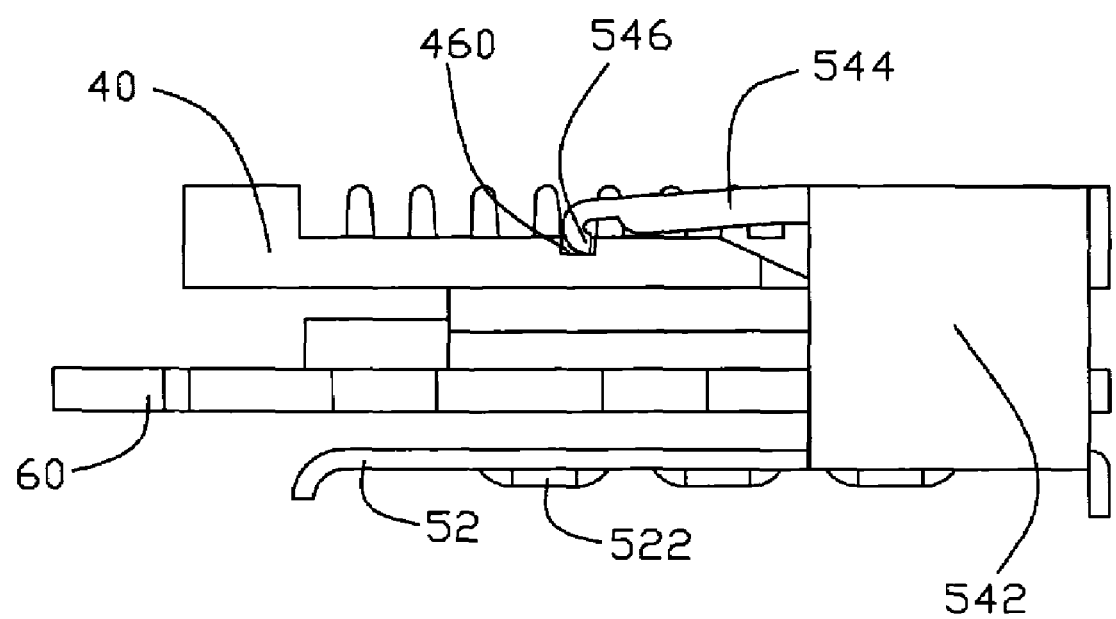
FIG. 6 is a view similar to FIG. 4, viewed from a lateral side aspect.

Referring to FIGS. 4-6, a memory module assembly is shown in accordance with another embodiment of the present invention. The memory module assembly in accordance with the second embodiment of the present invention comprises a heat sink 40, a clip 50 mounting the heat sink 40 onto a printed circuit board 60. The printed circuit board 60 generally has a rectangular shape. The printed circuit board 60 defines a through hole 64 in a front long side and an opening 66 near a rear long side thereof. The opening 66 is extended in a direction perpendicular to the front long side of the printed circuit board 60 and through the rear long side.

The heat sink 40 comprises a base 42 for contacting the heat-generating electronic component 32 and a plurality of fins 44 arranged on an upper surface of the base 42. The base 42 defines a pair of holes 420 in opposite sides thereof, respectively corresponding to the through hole 64 and the opening 66 of the printed circuit board 60, for rivets (not shown) to extend therethrough to mount the heat sink 40 on the printed circuit board 60. A pair of flakes 46 extends from opposite sides of the base 42. Each flake 46 defines a recess 460 in a middle portion thereof for engaging with the clip 50. The clip 50 has a rectangular-shaped body 52 and a pair of elastic hooks 54 upwardly and inwardly extending from opposite short sides of the body 52. The body 52 defines three slots 520 extending in a direction along long sides of the body 52 to form three ribs 522 on a bottom of the body 52 to strengthen the body 52 (see FIG. 6). Each hook 54 comprises a curved portion 542 extending from an edge of one of the short sides of the body 52, an elastic pressing portion 544 extending from the curved portion 542 and an engaging portion 546 extending from an free end of the pressing portion 544, for facilitating an engagement of the clip 50 with the heat sink 40. The curved portions 542 are arranged around the short sides of the printed circuit board 60. The short sides of the printed circuit board 60 are blocked between the curved portions 542. The pressing portion 544 defines a pair of notches 548 in an upper surface thereof, whereby ribs (better see in FIG. 6 and not labeled) are formed on a lower surface of the pressing portion 544 to strengthen the pressing portion 544. The engaging portions 546 are inclined toward the body 52 of the clip 50 and resist in the recesses 460 to avoid movement of the heat sink 40 in a direction along the short sides of the printed circuit board 60.

Referring to FIG. 4, the clip 50 clamps the heat sink 40 and the printed circuit board 60 together with the heat sink 40 and the printed circuit board 60 being sandwiched between the hooks 54 and the body 52 of the clip 50. The base 42 of the heat sink 40 is thus pressed toward the top surface of the heat-generating electronic component 32 mounted on the printed circuit board 60, to have an intimate contact with the top surface of the heat-generating electronic component 32 for receiving heat therefrom.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
    a printed circuit board having an electronic heat-generating electronic component mounted on a first face of the printed circuit board;
    a heat sink comprising a base and a plurality of fins arranged on the base, the heat sink defining a plurality of recesses therein, the base thermally contacting with the heat-generating electronic component; and
    a clip for securing the heat sink onto the heat-generating electronic component mounted on the printed circuit board, the clip comprising a body resting against a second face of the printed circuit board opposite the first face and a plurality of hooks extending from an edge of the body, each hook comprising an elastic pressing portion extending from the body, the pressing portions of the hooks being received in the recesses of the heat sink and resiliently pressing the base of the heat sink toward the heat-generating electronic component, whereby the clip clamps the heat sink and the printed circuit board together.

2. The memory module assembly as claimed in claim 1, wherein the body has a rectangular shape and comprises a pair of long sides and a pair of short sides, the hooks being inwardly extending from an edge of a long side of the body.

3. The memory module assembly as claimed in claim 2, wherein the body comprises a pair of blocks extending from the opposite short sides of the body and the printed circuit board is blocked between the blocks.

4. The memory module assembly as claimed in claim 3, wherein the hook further comprises a curved portion extending from an edge of the long side of the body and an engaging portion extending from a free end of the pressing portion, the engaging portions resting in the recesses of the heat sink.

5. The memory module assembly as claimed in claim 4, wherein the body defines a groove in a middle of the body and the groove is recessed in a direction along the long sides of the body to form a rib on a bottom of the body.

6. The memory module assembly as claimed in claim 1, wherein the body has a rectangular shape and comprises a pair of long sides and a pair of short sides, the hooks being inwardly extending from edges of the short sides of the body.

7. The memory module assembly as claimed in claim 6, wherein the base comprises a pair of flakes extending from edges of opposite sides thereof and the recesses are defined in the flakes.

8. The memory module assembly as claimed in claim 7, wherein the hooks each further comprise an engaging portion inclined toward the body of the clip and resting in the recess of a corresponding flake.

9. The memory module assembly as claimed in claim 8, wherein the body defines a plurality of slots in the body and the slots are recessed in a direction along the long sides of the body to form ribs on a bottom of the body.

* * * * *